(12) United States Patent
Detterbeck et al.

(10) Patent No.: US 9,597,703 B2
(45) Date of Patent: Mar. 21, 2017

(54) SLIT NOZZLE

(71) Applicant: LAM RESEARCH AG, Villach (AT)

(72) Inventors: Stefan Detterbeck, Villach (AT);
Thomas Passegger, Maria Rain (AT);
Bhaskar Bandarapu, Villach (AT);
Richard Findenig, Villach (AT)

(73) Assignee: LAM RESEARCH AG, Villach (AT)

( * ) Notice: Subject to any disclaimer, the term of this patent is extended or adjusted under 35 U.S.C. 154(b) by 105 days.

(21) Appl. No.: 14/625,353

(22) Filed: Feb. 18, 2015

(65) Prior Publication Data

US 2016/0236227 A1 Aug. 18, 2016

(51) Int. Cl.
*B05B 1/00* (2006.01)
*B05C 5/02* (2006.01)
*B05B 1/04* (2006.01)
*B05B 15/02* (2006.01)
*B05B 1/28* (2006.01)
*B05B 15/00* (2006.01)
*H01L 21/00* (2006.01)

(52) U.S. Cl.
CPC .............. *B05C 5/0254* (2013.01); *B05B 1/00* (2013.01); *B05B 1/04* (2013.01); *B05B 1/044* (2013.01); *B05B 1/28* (2013.01); *B05B 15/008* (2013.01); *B05B 15/02* (2013.01); *H01L 21/00* (2013.01)

(58) Field of Classification Search
CPC ......... B05C 5/0254; B05B 1/044; B05B 1/00; B05B 1/04; B05B 15/008; B05B 1/28; B05B 15/02; H01L 21/00

USPC ....... 239/104, 119, 120, 499, 590, 592, 597, 239/598, 461
See application file for complete search history.

(56) References Cited

U.S. PATENT DOCUMENTS

| 4,962,891 A * | 10/1990 | Layden ................... B05B 1/044 239/597 |
| 6,394,369 B2 * | 5/2002 | Goenka .................. B05B 1/042 239/592 |
| 6,602,382 B1 | 8/2003 | Matsuyama et al. |
| 7,429,004 B2 * | 9/2008 | Kondou .................... B05B 1/04 239/590 |
| 2003/0183167 A1 | 10/2003 | Kitazawa et al. |
| 2009/0130614 A1 | 5/2009 | Ookouchi et al. |

FOREIGN PATENT DOCUMENTS

JP 2011134797 A2 7/2011

* cited by examiner

*Primary Examiner* — Steven J Ganey

(57) ABSTRACT

A slit nozzle for dispensing liquid onto a surface of a wafer, comprises a nozzle body having a discharge opening whose length is from 10-100 mm and whose width is from 0.5-5 mm. The nozzle body has a dispensing chamber positioned upstream of the discharge opening and extending to the discharge opening, and a liquid distribution chamber positioned upstream of the dispensing chamber. The dispensing chamber and the liquid distribution chamber are in fluid communication with one another and are separated by a reduction section of the nozzle body whose cross-sectional area is at least 20% less than a cross-sectional area of each of the discharge opening and the liquid distribution chamber.

20 Claims, 3 Drawing Sheets

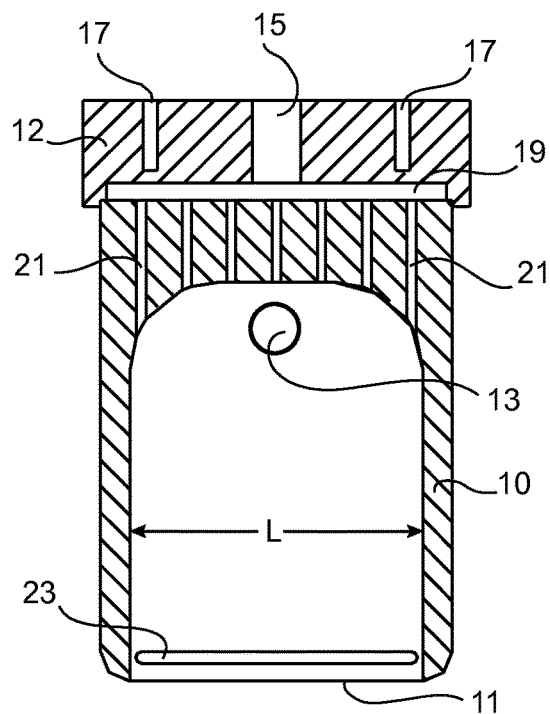
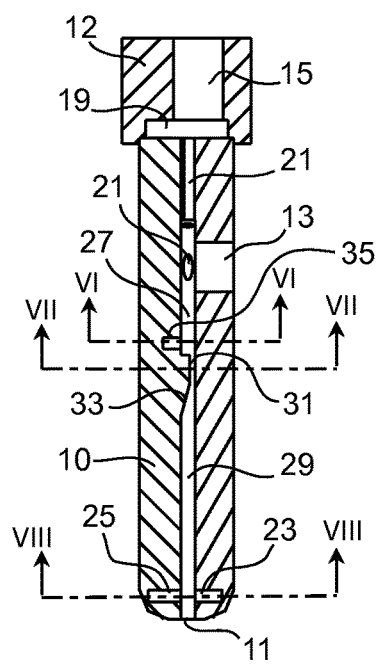
Fig. 3        Fig. 4
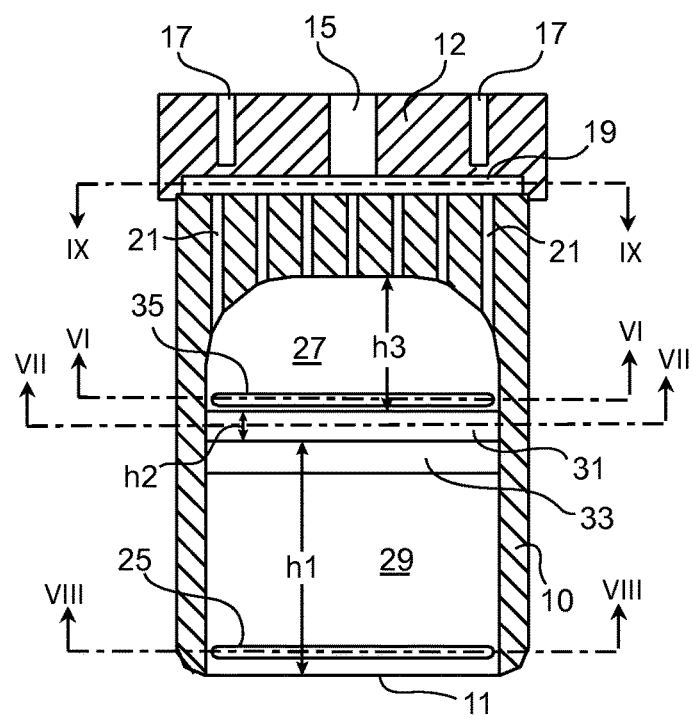
Fig. 5

SLIT NOZZLE

BACKGROUND OF THE INVENTION

The present invention relates to a slit nozzle, and more particularly a slit nozzle useful in an apparatus and method for processing wafer-shaped articles, such as semiconductor wafers.

During the manufacture of semiconductor devices the surfaces of the wafers from which the devices are formed go through various processes, a number of which involve dispensing process liquids and/or rinsing and cleaning liquids onto the wafer surface. Conventional nozzles dispense liquids through a circular outlet opening, such that the stream of liquid impinging on the wafer surface is generally cylindrical.

However, for certain processes it is desired to dispense the process liquid in more of a curtain shape, as is produced when the nozzle has a slit-shaped outlet opening.

Conventional slit nozzles are not well suited to use in liquid dispensers of apparatus for processing semiconductor wafers, however, because such apparatus have exacting requirements with respect to how quickly the dispensing of liquid commences after turning on the liquid supply, as well as how quickly and completely the liquid flow can be halted upon completion of a process, without residual drops of liquid falling on to the wafer surface. Moreover, the nozzle performance in each of these areas must be highly reproducible from one process iteration to the next.

SUMMARY OF THE INVENTION

The present inventors have developed slit nozzles whose performance in the above-mentioned areas is improved, and which are thus better-suited for use in liquid dispensers of apparatus for processing wafer-shaped articles such as semiconductor wafers.

Thus, in one aspect, the present invention relates to a slit nozzle for dispensing liquid onto a surface of a wafer, comprising a nozzle body having a discharge opening whose length is from 10-100 mm and whose width is from 0.5-5 mm. The nozzle body has a dispensing chamber positioned upstream of the discharge opening and extending to the discharge opening, and a liquid distribution chamber positioned upstream of the dispensing chamber. The dispensing chamber and the liquid distribution chamber are in fluid communication with one another and are separated by a reduction section of the nozzle body whose cross-sectional area is at least 20% less than a cross-sectional area of each of the discharge opening and the liquid distribution chamber.

In preferred embodiments of the slit nozzle according to the present invention, the dispensing chamber has a cross-sectional shape corresponding to the shape of the discharge opening, and a cross-sectional area that differs from the cross-sectional area of the discharge opening nozzle by less than 10%.

In preferred embodiments of the slit nozzle according to the present invention, the liquid distribution chamber has a cross-sectional shape corresponding to the shape of the discharge opening, and a cross-sectional area that differs from the cross-sectional area of the discharge opening nozzle by less than 10%.

In preferred embodiments of the slit nozzle according to the present invention, the cross-sectional area of the reduction section is at least 50% less than a cross-sectional area of each of the discharge opening, the dispensing chamber and the liquid distribution chamber.

In preferred embodiments of the slit nozzle according to the present invention, the cross-sectional area of the reduction section is at least 70% less than a cross-sectional area of each of the discharge opening, the dispensing chamber and the liquid distribution chamber.

In preferred embodiments of the slit nozzle according to the present invention, the length of the discharge opening is from 20-50 mm.

In preferred embodiments of the slit nozzle according to the present invention, the nozzle body comprises at least one first suction opening in the liquid distribution chamber.

In preferred embodiments of the slit nozzle according to the present invention, the nozzle body comprises at least one first suction opening in the liquid distribution chamber, at a distance of not more than 5 mm from the reduction section.

In preferred embodiments of the slit nozzle according to the present invention, the at least one first suction opening is elongated in a direction lengthwise of the liquid distribution chamber and parallel to the reduction section.

In preferred embodiments of the slit nozzle according to the present invention, at least one second suction opening is provided, which is located in the dispensing chamber.

In preferred embodiments of the slit nozzle according to the present invention, at least one second suction opening is provided, which is located in the dispensing chamber at a distance from the discharge opening of not more than 10 mm.

In preferred embodiments of the slit nozzle according to the present invention, the at least one second suction opening is elongated in a direction lengthwise of the discharge opening and parallel to the discharge opening.

In preferred embodiments of the slit nozzle according to the present invention, at least two second suction openings are provided, one on each side of the dispensing chamber.

In preferred embodiments of the slit nozzle according to the present invention, the width of the reduction section is less than the width of the dispensing chamber and the length of the reduction section differs from the length of the dispensing chamber by less than 30%.

In preferred embodiments of the slit nozzle according to the present invention, the liquid distribution chamber comprises a liquid inlet configured to connect to a liquid supply pipe so as to form an angle relative to the nozzle body of 45-90°.

In preferred embodiments of the slit nozzle according to the present invention, the liquid distribution chamber is tapered in an upper portion thereof.

In preferred embodiments of the slit nozzle according to the present invention, the liquid distribution chamber is rounded at an upper portion thereof.

In preferred embodiments of the slit nozzle according to the present invention, the liquid distribution chamber is rounded at an upper portion thereof, at a radius of not more than 50% of the length of the distribution chamber and not less than the width of the distribution chamber.

In preferred embodiments of the slit nozzle according to the present invention, the nozzle body has a vertical extent h1 from a narrowest area of the reduction section to the discharge opening in the range of 10-100 mm.

In preferred embodiments of the slit nozzle according to the present invention, the dispensing chamber comprises a transition region where the width of the dispensing chamber gradually increases from the width of the reduction section to the width of the discharge opening.

In preferred embodiments of the slit nozzle according to the present invention, this transition area is in the range of 10% to 100% of the distance h1.

In preferred embodiments of the slit nozzle according to the present invention, the reduction section has a vertical extent h2 of 0-100 mm.

In preferred embodiments of the slit nozzle according to the present invention, the liquid distribution chamber has a vertical extent h3 from the reduction section to the upper end of the liquid distribution chamber that is greater than or equal to the width of the distribution chamber.

In another aspect, the present invention relates to a liquid dispenser for use in an apparatus for processing wafer-shaped articles, comprising a dispensing arm that is movable in a horizontal plane and a slit nozzle affixed to a distal end of the dispensing arm, the slit nozzle being as described above.

In still another aspect, the present invention relates to an apparatus for processing wafer-shaped articles, comprising a chuck for holding a wafer-shaped article to be processed, and a liquid dispenser comprising a dispensing arm that is movable in a horizontal plane and a slit nozzle affixed to a distal end of the dispensing arm, the slit nozzle being as described above.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 3 is a sectional view along the line III-III of FIG. 2;

FIG. 4 is a sectional view on a plane perpendicular to the plane of the sectional view of FIG. 3, and bisecting the opening 15;

FIG. 5 is a sectional view on the same plane as in FIG. 3, of the opposite side of the slit nozzle;

DETAILED DESCRIPTION

Figure 1:
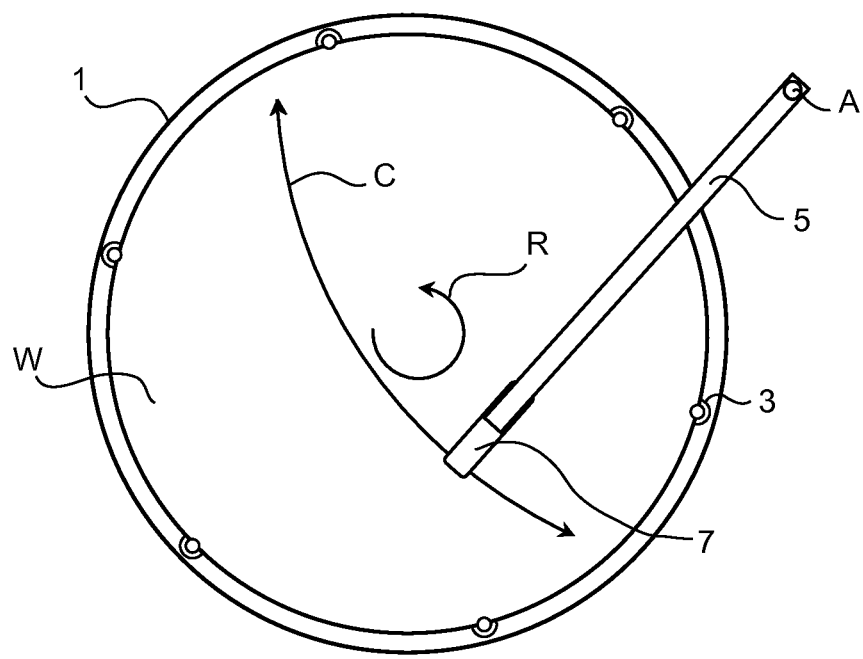
FIG. 1 is a schematic plan view of an apparatus for wet wafer treatment, that includes a liquid dispenser equipped with a slit nozzle, according to an embodiment of the present invention.

In FIG. 1, an apparatus for wet processing of single semiconductor wafers comprises a spin chuck 1 for supporting and rotating a wafer W in the direction of arrow R. Spin chuck 1 comprises a circular series of gripping pins 3, which serve to support wafer W at its peripheral edge only. A liquid dispenser comprises a dispenser arm 5 that is positioned a distance above the chuck 1 and wafer W. The dispenser arm 5 in this embodiment is movable in a horizontal plane along a horizontal arc C, by virtue of its being mounted for pivotal movement about a vertical axis A. Alternatively, the dispenser arm could be mounted for linear movement in a horizontal plane. Dispenser arm 5 carries a slit nozzle 7 at its distal end, such that the outlet of the slit nozzle 7 is positioned a predetermined distance above the upwardly-facing surface of the wafer W.

Figure 2:
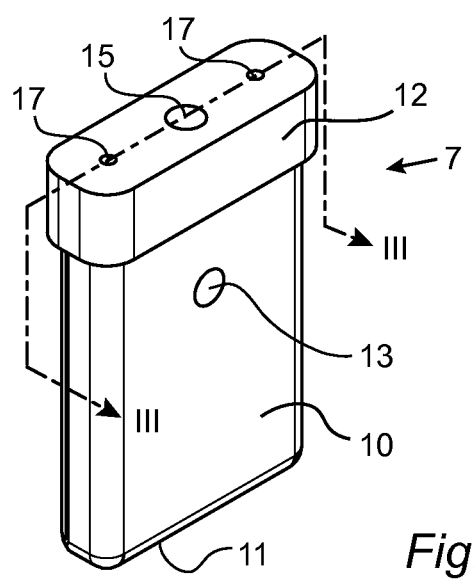
FIG. 2 is a perspective view of a slit nozzle according to a preferred embodiment of the present invention.
Figure 6:
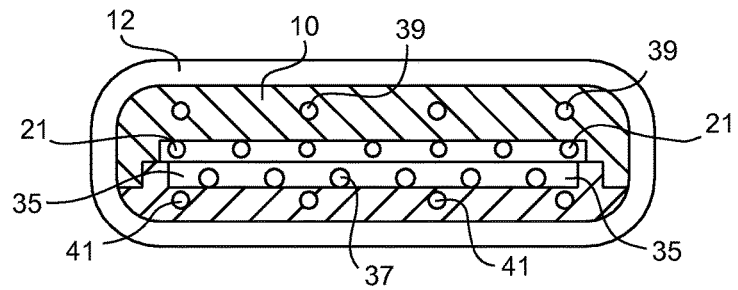
FIG. 6 is a sectional view along the line VI-VI of FIG. 5.
Figure 7:
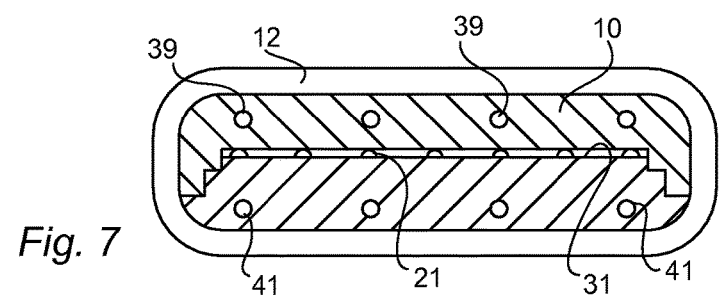
FIG. 7 is a sectional view along the line VII-VII of FIG. 5.
Figure 8:
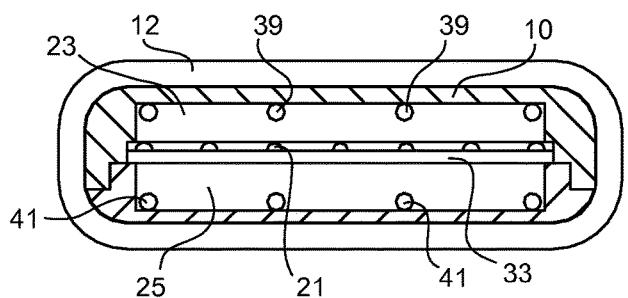
FIG. 8 is a sectional view along the line VIII-VIII of FIG. 5.

In FIG. 2, it can be seen that the slit nozzle 7 of a preferred embodiment comprises a nozzle body 10 that terminates at its lower end in a dispensing opening 11, and which is joined at its upper end to a top portion 12, which may be rigidly secured to the body 10 or formed integrally therewith. Nozzle body 10 comprises a liquid inlet 13 through which liquid is introduced via a suitable supply conduit in dispenser arm 5, whereas the top portion 12 comprises suction opening 15, which communicates with a suction conduit in dispenser arm 5, and blind bores 17, which are used for correctly positioning and mounting the slit nozzle 7 on the dispenser arm 5.

FIG. 3 shows that the suction opening 15 communicates with a chamber 19 located where the body 10 meets the top portion 12. Chamber 19 in turn communicates with a first row of seven narrow bores 21, which open at their upper ends into chamber 19 and at their lower ends into the top of the interior volume of the nozzle body 10. Also visible in FIG. 3 is an elongated opening 23 formed as a recess in the inner surface of nozzle body 10, whose function will be explained in connection with the ensuing figures.

As shown in FIG. 4, the interior volume of the nozzle body 10 is divided into an upper liquid distribution chamber 27 and a lower liquid dispensing chamber 29, by a reduction section 31. The reduction section is a region in which the cross-sectional area of the interior volume of the nozzle body 10 is reduced in relation to the upstream and downstream chambers 27, 29. In this embodiment, as shown in FIG. 3, the length L (i.e., the longer horizontal dimension) of the interior volume of the nozzle body 10 is essentially constant over the entire vertical extent of the interior volume, with the exception of the rounded top region; however, as shown in FIG. 4, the width of that interior volume (i.e., the perpendicular shorter horizontal dimension) is significantly less at the reduction section 31 than the width in the liquid distribution chamber 27 above and the liquid dispensing chamber 29 below.

In particular, it is preferred that the length L of discharge opening 11, liquid discharge chamber 27 and liquid dispensing chamber 29 are each about 10-100 mm, more preferably 20-50 mm. The cross-sectional area of the liquid dispensing chamber 29 preferably differs from that of the discharge opening 11 by less than 10%, more preferably by less than 5%.

On the other hand, the width of each of these elements is preferably from 0.5-5 mm. At the reduction section, the cross-sectional area of the interior volume of the nozzle body 10 is preferably at least 20% less than a cross-sectional area of each of the liquid distribution chamber 27 and liquid dispensing chamber 29, more preferably at least 50% less and most preferably at least 70% less.

As shown in FIG. 4, the reduction section 31 preferably gradually widens into the dispensing chamber 29 via a tapered region 33. On the other hand, the reduction section 31 in this embodiment terminates abruptly at its upper end, where the liquid distribution chamber has its full width.

FIG. 4 also shows two additional elongated openings formed as recesses in the inner surface of nozzle body 10, namely, an opening 25 facing the opening 23 in the liquid dispensing chamber 29, and an opening 35 formed just above the reduction section 31 in the liquid distribution chamber 27. Preferably, at least one second suction opening is provided in the dispense chamber. Preferably, the lower edge of openings 23, 25 is not more than 10 mm above the discharge opening 11, and more preferably not more than 5 mm above. The lower edge of opening 35 is preferably not more than 5 mm above the reduction section 31, and more preferably not more than 2 mm above.

Turning now to FIG. 5, several preferred dimensional relationships of certain elements of the slit nozzle are illustrated. In particular, the liquid dispensing chamber 29 preferably has a vertical extent h1 as measured from the outlet opening 11 to the lower edge of the reduction section 31 that is in the range of 10-100 mm.

The reduction section 31 preferably has a vertical extent h2 that is in the range of 0-100 mm. When the vertical extent of h2 is 0 mm, this signifies that the reduction section 31 consists of only an edge formed at the upper end of the tapered region 33, which then steps back horizontally to the full width of the liquid distribution chamber 27.

The dimension h3 refers to the vertical extent of the liquid distribution chamber 27, as measured from the upper edge of the reduction section 31 to the topmost surface of the liquid distribution chamber 27. That dimension h3 is preferably at least as great as the length of the liquid distribution chamber 27.

FIGS. 6-9 more fully illustrate the suction conduits provided in the slit nozzle 7 of the present embodiment. In addition to the row of seven conduits 21 described above, there are three additional rows of narrow conduits, with the four rows being arranged in parallel to one another. In particular, a first row of four conduits 39 passes through one side wall of the nozzle body (see FIGS. 6 and 7), opening at their proximal ends into the chamber 19 (see FIG. 9), and opening at their distal ends into the elongated horizontal recess opening 23 (see FIG. 8). Similarly, a second row of four conduits 41 passes through the opposite side wall of the nozzle body (see FIGS. 6 and 7), opening at their proximal ends into the chamber 19 (see FIG. 9), and opening at their distal ends into the elongated horizontal recess opening 25 (see FIG. 8).

Figure 9:
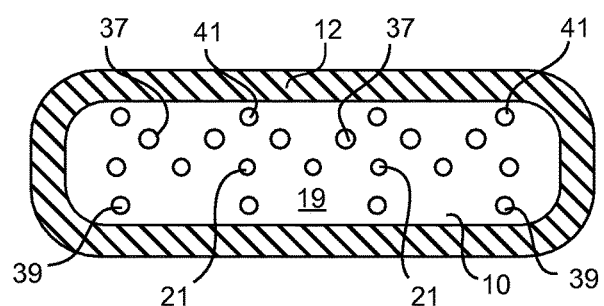
FIG. 9 is a sectional view along the line IX-IX of FIG. 5.

The last row of suction conduits in this embodiment is the group of six conduits 37, which pass through one side wall of the nozzle body, but only within the upper part thereof. That is, conduits 37 open at their proximal ends into the chamber 19 (see FIG. 9), and open at their distal ends into the elongated horizontal recess opening 35 (see FIG. 6). Thus, as shown in FIG. 9, all 21 of the aforementioned suction conduits open at their proximal ends into the chamber 19, whereas the conduits of each of the four rows open at respectively different locations at their distal ends, as described above.

In use, a semiconductor wafer W, such as a silicon wafer of 300 mm or 450 mm diameter, is positioned above the chuck 1, gripping pins 3 are moved radially inwardly in a manner known per se, so as to grip the wafer W at its outer edge only, and the motor of chuck 1 is turned on so as to cause the chuck and wafer W to rotate at a predetermined speed, in the direction of arrow R.

Process liquid is then fed through a supply conduit in the dispenser arm 5, and into the inlet opening 13 of the slit nozzle 7. The process liquid thus flows into the liquid distribution chamber 27 where, by virtue of the reduction section 31, the liquid is caused to be distributed across the full length L of chamber 27, from whence it passes across the reduction section 31, into the dispensing chamber 29, and is discharged through the outlet opening 11 and onto the upwardly-facing surface of the semiconductor wafer W. The dispenser arm 5 is typically pivoted during this dispensing, about the axis A, so as to cause the slit nozzle to travel across the surface of the rotating wafer W along the arc C.

The interior configuration of the slit nozzle 7 as described above causes the liquid discharged from the slit nozzle to have a consistent shape in less than one second after turning on of the dispenser, which is an improvement in relation to conventional slit nozzles.

When the processing is complete, the liquid dispenser is turned off and simultaneously suction is applied to the suction port 15, and if desired also to the liquid inlet 13. The configuration of the elongated openings 23, 25, 35, conduits 21, 37, 39, 41 chamber 19 and port 15 as described above permits the residual process liquid in the slit nozzle 7 to be more quickly and reliably evacuated than in the case of conventional slit nozzles.

Fast and reliable evacuation of residual process liquid from the slit nozzle is important in the context of wet processing of single semiconductor wafers, because if droplets of residual process liquid are permitted to fall from the nozzle onto the wafer surface after completion of processing (or prior to commencement of a next process iteration), the nano-scale device structures already formed on the wafer can be damaged, resulting in a lower yield rate of chips or spoilage of the wafer altogether.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. A slit nozzle for dispensing liquid onto a surface of a wafer, comprising:
   a nozzle body including a discharge opening whose length is in a range from 10-100 mm and whose width is in a range from 0.5-5 mm;
   a dispensing chamber positioned upstream of the discharge opening and extending to the discharge opening; and
   a liquid distribution chamber positioned upstream of the dispensing chamber,
   wherein the dispensing chamber and the liquid distribution chamber are in fluid communication with one another and are separated by a reduction section of the nozzle body whose cross-sectional area is at least 20% less than a cross-sectional area of each of the discharge opening and the liquid distribution chamber.

2. The slit nozzle according to claim 1, wherein the dispensing chamber has a cross-sectional shape corresponding to a shape of the discharge opening, and a cross-sectional area that differs from the cross-sectional area of the discharge opening nozzle by less than 10%.

3. The slit nozzle according to claim 1, wherein the liquid distribution chamber has a cross-sectional shape corresponding to a shape of the discharge opening, and a cross-sectional area that differs from the cross-sectional area of the discharge opening nozzle by less than 10%.

4. The slit nozzle according to claim 1, wherein the cross-sectional area of the reduction section is at least 50% less than a cross-sectional area of each of the discharge opening, the dispensing chamber and the liquid distribution chamber.

5. The slit nozzle according to claim 1, wherein the cross-sectional area of the reduction section is at least 70% less than a cross-sectional area of each of the discharge opening, the dispensing chamber and the liquid distribution chamber.

6. The slit nozzle according to claim 1, wherein a length of the discharge opening is from 20-50 mm.

7. The slit nozzle according to claim 1, wherein the nozzle body comprises at least one first suction opening in the liquid distribution chamber.

8. The slit nozzle according to claim 7, wherein the at least one first suction opening is elongated in a direction lengthwise of the liquid distribution chamber and parallel to the reduction section.

9. The slit nozzle according to claim 7, further comprising at least one second suction opening in the dispensing chamber.

10. The slit nozzle according to claim 9, wherein the at least one second suction opening is elongated in a direction lengthwise of the discharge opening and parallel to the discharge opening.

11. The slit nozzle according to claim 9, further comprising at least two second suction openings, one arranged on each side of the dispensing chamber.

12. The slit nozzle according to claim 7, further comprising at least one second suction opening in the dispensing chamber at a distance from the discharge opening of not more than 10 mm.

13. The slit nozzle according to claim 1, wherein the nozzle body comprises at least one first suction opening in the liquid distribution chamber, at a distance of not more than 5 mm from the reduction section.

14. The slit nozzle according to claim 1, wherein a width of the reduction section is less than a width of the dispensing chamber and a length of the reduction section differs from a length of the dispensing chamber by less than 30%.

15. The slit nozzle according to claim 1, wherein the liquid distribution chamber comprises a liquid inlet configured to connect to a liquid supply pipe so as to form an angle relative to the nozzle body in a range from 45-90°.

16. The slit nozzle according to claim 1, wherein the liquid distribution chamber is tapered in an upper portion thereof.

17. The slit nozzle according to claim 1, wherein the nozzle body has a vertical extent h1 from a narrowest area of the reduction section to the discharge opening in a range from 10-100 mm.

18. The slit nozzle according to claim 1, wherein the dispensing chamber comprises a transition region where a width of the dispensing chamber gradually increases from a width of the reduction section to a width of the discharge opening.

19. The slit nozzle according to claim 1, wherein the reduction section has a vertical extent h2 in a range from 0-100 mm.

20. The slit nozzle according to claim 1, wherein the liquid distribution chamber has a vertical extent h3 from the reduction section to an upper end of the liquid distribution chamber that is greater than or equal to a width of the liquid distribution chamber.

* * * * *